United States Patent [19]
Cross

[11] Patent Number: 5,442,654
[45] Date of Patent: Aug. 15, 1995

[54] PHASE MODULATION MEASUREMENT SYSTEM

[75] Inventor: Stephen T. Cross, Morrison, Colo.

[73] Assignee: The United States of America as represented by the Secretary of the Air Force, Washington, D.C.

[21] Appl. No.: 103,010

[22] Filed: Aug. 6, 1993

[51] Int. Cl.$^6$ ............................................. H04B 3/46
[52] U.S. Cl. .................... 375/224; 324/76.11; 340/870.25; 455/226.1
[58] Field of Search ............... 375/10, 25, 39, 102, 375/83; 324/787, 130; 455/226.1; 340/870.18, 870.25

[56] References Cited

U.S. PATENT DOCUMENTS

| | | | |
|---|---|---|---|
| 4,354,278 | 10/1982 | Clark et al. | 455/617 |
| 4,635,260 | 1/1987 | Sectan | 371/22 |
| 4,763,317 | 8/1988 | Lehman et al. | 370/58 |
| 4,800,575 | 1/1989 | Anderson | 375/80 |
| 4,833,466 | 5/1989 | Lowenson et al. | 340/825.5 |
| 4,961,206 | 10/1990 | Tomlinson et al. | 375/39 |
| 5,001,727 | 3/1991 | McDavid | 375/80 |
| 5,068,876 | 11/1991 | Yashikawa et al. | 375/80 |
| 5,249,203 | 9/1993 | Loper | 375/97 |

Primary Examiner—Stephen Chin
Assistant Examiner—T. Ghebretinsae
Attorney, Agent, or Firm—William G. Auton

[57] ABSTRACT

Telemetry signals from missiles experience extreme phase distortion during interstage separation events. A phase modulation measurement system can calculate the steady state phase deviation of a biphase telemetry transmitter using: a telemetry receiver, a demodulator, a digitizer oscilloscope and a computer. The telemetry receiver receives and down converts phase modulated telemetry signals into intermediate frequency signals which are demodulated by the demodulator. After the digitizing oscilloscope digitizes the demodulated signals, the computer calculates the phase deviation.

1 Claim, 1 Drawing Sheet

PHASE MODULATION MEASUREMENT SYSTEM

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to telemetry transmitters, and more specifically the invention pertains to a system which measures the steady state phase deviation of a biphase modulated telemetry transmitter, the modulation source being a pulse coded modulation (PCM) bit stream.

In phase modulation, the term "phase deviation" refers to the peak difference of the relative phase angle of the sine wave carrier do to the modulating signal as expressed in radians or degrees. The task of measuring the steady state phase deviation in a phase modulated telemetry transmitter is accomplished, to some extent, by the systems disclosed in the following U.S. Patents, the disclosure of which are incorporated herein by reference:

U.S. Pat. No. 4,354,278 issued to Clark et al;
U.S. Pat. No. 4,635,260 issued to Sestan;
U.S. Pat. No. 4,763,317 issued to Lehman et al; and
U.S. Pat. No. 4,833,466 issued to Lowenson et al.

The method commonly used to determine phase deviation involves measuring a carrier null on a spectrum analyzer. But that method is only accurate if a square wave is used as the modulating signal. In some test situations for telemetry transmitters, an indeterminate bit stream is the only source available to modulate the carrier signal, and a need remains to provide a new method of determining phase deviation. The present invention is intended to satisfy that need.

SUMMARY OF THE INVENTION

The present invention includes a system for measuring the steady state phase deviation of a telemetry transmitter. One embodiment of the invention uses: a telemetry receiver, a biphase demodulator, a two channel digital oscilloscope, a microwave generator, a function generator, a spectrum analyzer, and assorted switching and routing components.

The telemetry transmitter transmits a phase modulated telemetry signal. A diplexer and a first RF switch are used as the telemetry transmitter transmits a phase modulated telemetry signal. An RF switch is used as a coupling unit to conduct the phase modulated telemetry signal to the telemetry receiver.

The telemetry receiver receives and down converts the phase modulated telemetry signal to an intermediate frequency (IF) signal equivalent. The biphase demodulaton demodulates the IF signal utilizing a modified cost coop which results in both the inphase (I) and quadrature (Q) components.

The I and Q components are digitized by the digitizing oscilloscope and sent to the computer. The computer utilizes the digitized data to compute the steady state phase deviation using the following formula:

$$\phi_{ss} = [i=1, n \ \arctan \ (I_i Q_i)]/n$$

where $\phi_{ss}$ = one sided steady state phase deviation $I_i$ = each successive I sample across the third bit time $Q_i$ = each successive Q sample across the third bit time.

n = number of samples per bit time

This computation is performed for both "high" bit and "low" bit with a relatively short time delta between the two bits. The difference between the two values is divided by two to determine final phase deviation result. This result is corrected to eliminate system errors and this final value is evaluated against acceptance criteria. The respective generated and measured deviation levels are recorded for use during the transmitter measurement.

The present invention also includes a system calibration which serves as a means for determining errors in the phase deviation measurement system. The system calibration subsystem includes:

a phase modulated microwave generator, a function generator, a spectrum analyzer, and a directed coupler.

The microwave generator produces a carrier frequency signal which is phase modulated by the function generator to produce a phase modulated test signal. The directed coupler conducts the phase modulated test signal to both the spectrum analyzer and to the first RF switch, which conducts the phase modulated signal back through: the telemetry receiver, biphase demodulator, digital oscilloscope and computer where phase deviation is calculated. The phase deviation error of the system is calculated as the difference of the phase deviation measured using the described system and the actual phase deviation measured by the spectrum analyzer.

It is an object of the invention to measure the steady state phase deviation of telemetry transmitters.

It is another object of the invention to provide a self-testing capability to a phase deviation measurement system.

These objects together with other objects features and advantages of the invention will become more readily apparent from the following detailed description when taken in conjunction with the accompanying drawing wherein like elements are given like reference numerals throughout.

BRIEF DESCRIPTION OF THE DRAWINGS

The sole figure of the drawings is FIG. 1, which is a block diagram of the phase deviation measurement system of the present invention.

DETAILED DESCRIPTION OF THE PREFERRED EMBODIMENT

Figure 1:
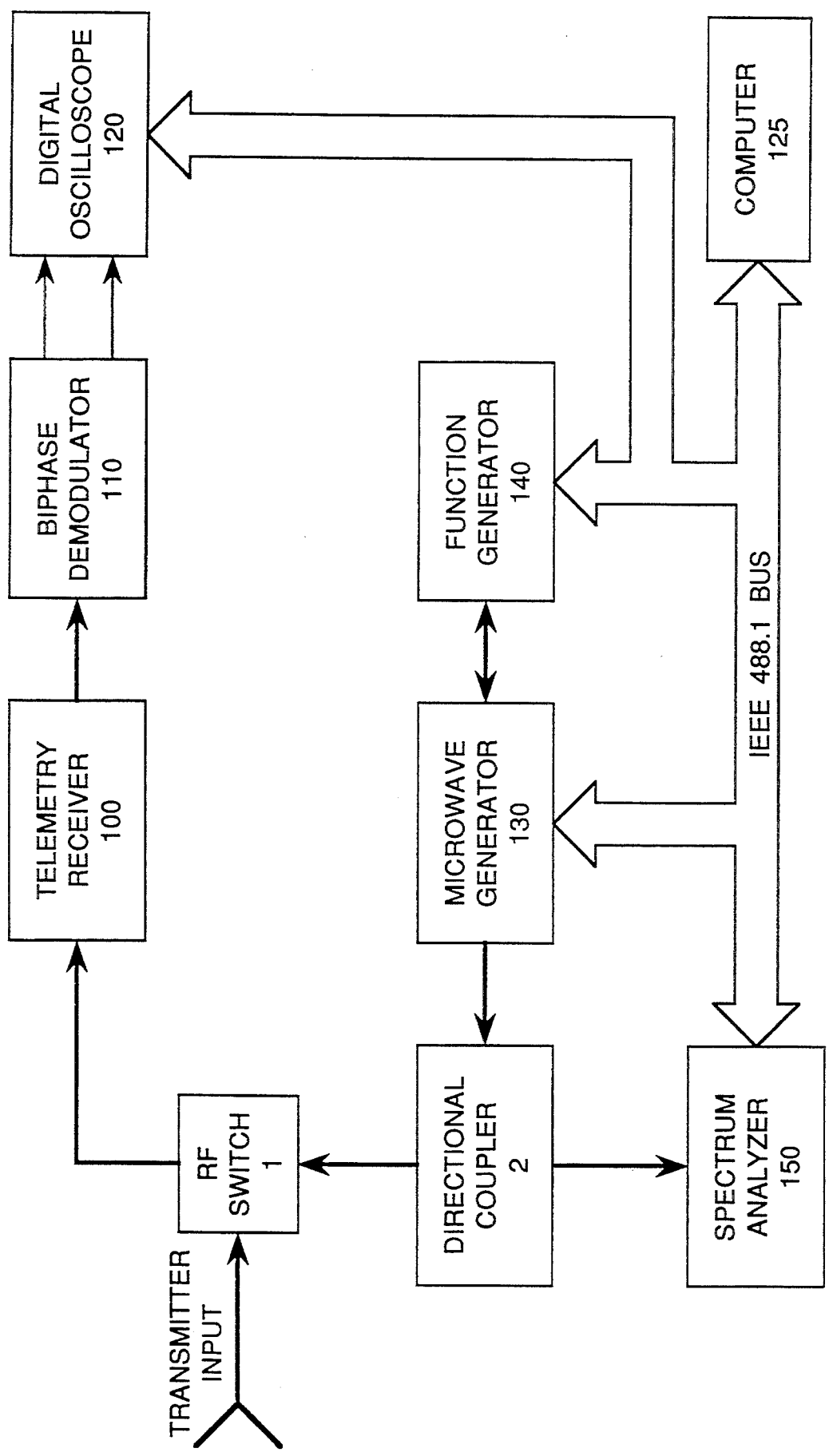

The present invention includes a pre-calibrated phase modulation measurement system to measure the steady state phase deviation of a telemetry transmitter. The system consists of hardware and software to both calibrate the system and perform the transmitter measurement. The individual hardware items within the system are all commercial equipment. The system configuration as well as the software is described below.

The phase measurement system hardware configuration is shown in FIG. 1. The system consists of a telemetry receiver, a biphase demodulator, a two channel digital oscilloscope, a microwave generator, a function generator, a spectrum analyzer, and assorted switching and routing components. The list of equipment used is listed below in Table 1.

TABLE 1

| | |
|---|---|
| Telemetry Receiver | Microdyne 1400MR |
| Biphase Demodulator | Aydin 321B |
| Digital Oscilloscope | HP 54201 |
| Microwave Generator | HP 8660(86634) |
| Function Generator | HP 3325A |
| Spectrum Analyzer | HP 8566A |
| Computer | HP 9920 |
| RF Switches | HP 33311 |
| Switch Controller | HP 11713A |

The deviation test methodology consists of two parts, the system calibration and the transmitter phase deviation measurement. The system calibration determines the errors in the system for which it will be compensated. The transmitter measurement insures sufficient signal type, normalizes the results utilizing the calibration data, and calculates the steady state phase deviation.

The system calibration and subsequent error compensation is utilized to meet the 5% accuracy requirement for the test. Initially, the microwave generator is set to the transmitter center frequency with a power level of −10dBm. The output signal of the microwave generator is routed to the spectrum analyzer and the CW power level is measured. Next, the function generator is set up to phase modulate the microwave generator with a 100 khz square wave. The amplitude of the square wave is increased until the carrier levels indicated on the spectrum analyzer correspond to deviation levels of 85, 90, and 95 degrees. The respective square wave amplitude levels for each level of deviation are recorded.

These calibrated signals are successively routed to the measurement equipment to determine the errors within the system. The microwave signal is routed to the telemetry receiver to be down converted to a 10Mhz IF signal. This IF signal is routed to the biphase demodulator for demodulating into inphase(I) and quadrature(Q) detected outputs. The I and Q outputs are routed to the oscilloscope for digitizing. The RFTS computer utilizes the digitized data to compute the steady state phase deviation using the following formula:

$$\phi_{ss} = [i=1, n \text{ arctan } (I_i/Q_i)]/n$$

where
 $\phi_{ss}$ = one sided steady state phase deviation
 $I_i$ = each successive I sample across the third bit time
 $Q_i$ = each successive Q sample across the third bit time.
 n = number of samples This computation is performed for both a "high" bit and "low" bit with a relatively short time delta between the two bits. The two values is divided by 2 to determine final phase deviation result. The respective generated and measured deviation levels are recorded for use during the transmitter measurement.

The transmitter phase deviation measurement methodology is the same as that described in the preceding paragraph with the addition of a few steps. The transmitter output signal is routed through the telemetry receiver, biphase demodulator, and oscilloscope with the appropriate down converting, demodulation, and digitizing. The test algorithm initially determines if the demodulator has locked on to the transmitter inverted or inphase. The switch prior to the receiver is cycled until the demodulator locks in phase. The I trace is then evaluated to determine if four successive high bits and four successive low bits have been captured. When the necessary bit pattern is present, the computation described in the previous paragraph is performed on this data.

The calibration data is now used to normalize the measured results and correct for the measurement system error. The measured transmitter results are compared to the calibration data for 85, 90, and 95 degrees. An extrapolation/interpolation is performed to correct the measured values. This process is repeated five times to obtain transmitter deviation values. These values are averaged to minimize low frequency residual phase noise with the result being the standard deviation value evaluated for the pass/fail of the test.

While the invention has been described in its presently preferred embodiment it is understood that the words which have been used are words of description rather than words of limitation and that changes within the portion of the appended claims may be made without departing from the scope and spirit of the invention in its broader aspects.

What is claimed is:

1. A phase modulation measurement system which measures amounts of steady state phase deviation in a phase modulated telemetry signal produced by a telemetry transmitter, said phase modulation measurement system comprising:
    an input which is electrically coupled to said telemetry transmitter to receive and conduct said phase modulated telemetry signal therefrom;
    a telemetry receiver which receives and demodulates the phase modulated telemetry signal from the input to produce thereby inphase signal and quadrature signal;
    an RF switch which is electrically connected between said input and said telemetry receiver to conduct said phase modulated telemetry signal therebetween;
    a means for digitizing the inphase and quadrature signals from the telemetry receiver to produce a digital series of I samples and Q samples; and
    a computer which receives the I samples and Q samples from the digitizinq means to compute the steady state phase deviation, using a formula given by:

$$\phi_{ss} = [i=i, n \text{ arctan } (I_i/Q_i)]/n$$

where
 $\phi_{ss}$ one sided steady state phase deviation;
 $I_i$ = each successive I sample across a third bit time; and
 $Q_i$ = each successive Q sample across a third bit time.
 n = number of samples, and
 wherein said digitizing means comprises a digital oscilloscope which is electrically connected to said computer to digitize the inphase and quadrature signals into the digitized series of I samples and Q samples.

* * * * *